United States Patent [19]
Pinault

[11] Patent Number: 5,949,656
[45] Date of Patent: Sep. 7, 1999

[54] ELECTRONIC ASSEMBLY INTERCONNECTION SYSTEM

[75] Inventor: Michael Pinault, Hudson, N.H.

[73] Assignee: Davox Corporation, Weston, Mass.

[21] Appl. No.: 08/252,335

[22] Filed: Jun. 1, 1994

[51] Int. Cl.⁶ .................................................. H05K 1/14
[52] U.S. Cl. ........................ 361/788; 361/785; 361/803; 174/261; 439/65
[58] Field of Search .................................. 174/250, 261; 361/796, 798, 754, 788, 785, 803; 439/59, 61, 65

[56] References Cited

U.S. PATENT DOCUMENTS

| | | | |
|---|---|---|---|
| 3,992,686 | 11/1976 | Canning | 333/84 M |
| 4,511,950 | 4/1985 | Bunner et al. | 361/413 |
| 4,947,288 | 8/1990 | Olsson et al. | 361/413 |
| 5,315,488 | 5/1994 | Le Gallo et al. | 361/796 |
| 5,343,361 | 8/1994 | Rudy et al. | 361/710 |

FOREIGN PATENT DOCUMENTS 0220677   5/1987   European Pat. Off. ................ 361/796

OTHER PUBLICATIONS

W.R. Guttridge et al., "Modularized PC Assembly", IBM Technical Disclosure Bulletin, Nov. 1977, vol. 20, No. 6 pp. 2162–2163.

*Primary Examiner*—Hyung-Sub Sough
*Attorney, Agent, or Firm*—Bourque and Associates, PA

[57] ABSTRACT

A apparatus and method of interconnecting printed circuit boards in an electronic system inside a card cage. The apparatus includes a companion printed circuit board that connects to the main printed circuit board through a first electrical connector, the companion card providing at least one electrical path to a second connector. This second connector connects to the back plane of the card cage, with the back plane providing at least one electrical connection from the second connector to another electrical connector which connects to another companion card connected to the back plane. This method of interconnection avoids requiring flexible cable interconnections, thereby providing a cleaner layout of the electronic system, allowing easy insertion and removal of the main printed circuit boards as well as the companion cards, and providing excellent noise shielding.

17 Claims, 3 Drawing Sheets

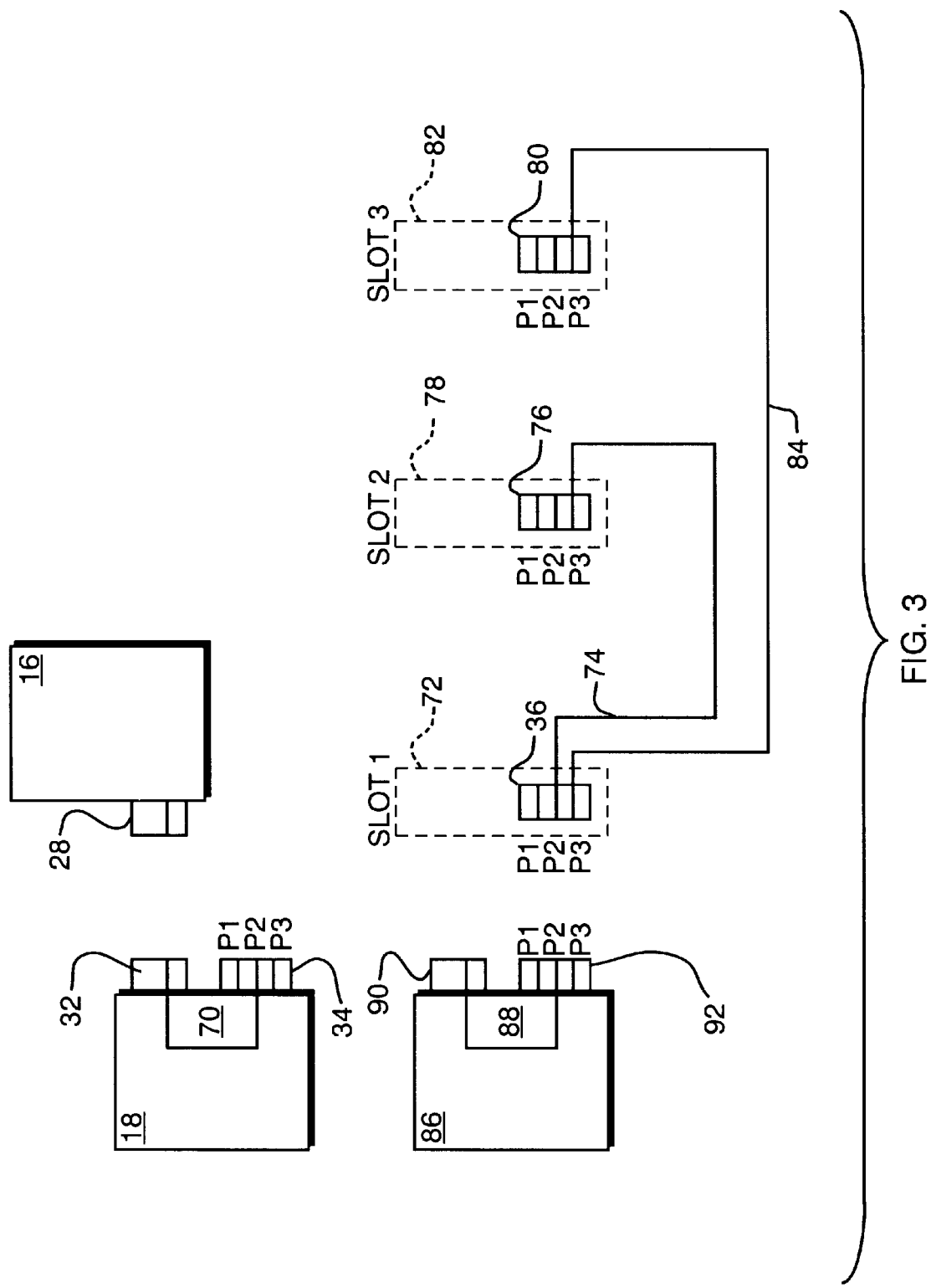

5,949,656

ELECTRONIC ASSEMBLY INTERCONNECTION SYSTEM

RELATED APPLICATION

This Application is related to co-pending U.S. patent application Ser. No. 08/252,336, which was filed Jun. 1, 1994, entitled MULTI-PATH DIGITAL SIGNAL PROCESSOR assigned to the assignee of the present invention, and incorporated herein by reference.

FIELD OF THE INVENTION

This invention relates to a way of interconnecting printed circuit cards or boards in an electronic system and more particularly, to a paddle printed circuit board for providing interconnection between printed circuit cards.

BACKGROUND OF THE INVENTION

In a complex electronic system, there are many ways of interconnecting the many individual printed circuit boards. When the printed circuit boards are contained within a card cage, a back plane often provides slot specific connections requiring that printed circuit boards be in assigned slots. Ribbon cables can also be used which do not require printed circuit boards to be in assigned slots in the card cage. However, ribbon cables are not a complete solution since they are difficult to route, noisy and often do not have enough connections. Also, when printed circuit boards are going to be removed from the card cage, the ribbon cables require extra time and effort to disconnect and reconnect afterwards. Further more, ribbon cables are prone to failure and provide poor noise shielding, which is a requirement for many systems.

Another solution is to have board-to-board connectors which require the two printed circuit boards requiring interconnection to be physically next to each other in the card cage, and providing a simple connector between the two boards. However, this takes up space on the front of the card cage or boards, and still needs to be removed when the cards are going to be removed from the card cage.

Accordingly, what is needed is an interconnection system that allows printed circuit boards to be quickly removed from the system; allows cards to be put in slots other than assigned slots in the backplane; and provide good noise shielding.

SUMMARY OF THE INVENTION

In accordance with the present invention, an electronic assembly interconnection system which can provide interconnections in a printed circuit board card cage is provided. The companion card connects to a main printed circuit board through a first connector and provides at least one electrical path to a second connector which connects to the back plane of the card cage. The back plane of the card cage provides electrical paths to other connectors which connect to other paddle board cards in the card cage. By using a paddle board card instead of a ribbon cable, easy insertion and removal of both the main card and the companion card are provided for. The paddle printed circuit board can include at least one other connector for providing a connection to peripheral devices outside of the electronic system. A plurality of electrical paths connect via least one third connector to the first or second connector. The electrical paths provided in the back plane may be provided via wire wrapping terminal connectors, or a printed circuit board connections, similar to a back plane bus.

DESCRIPTION OF THE DRAWINGS

These and other features and advantages of the present invention will be better understood by reading the following detailed description, taken together with the drawings wherein:

FIG. 3 is a schematic showing connections between companion cards and the back plane of the card cage.

DETAILED DESCRIPTION OF THE PREFERRED EMBODIMENT

Figure 1:
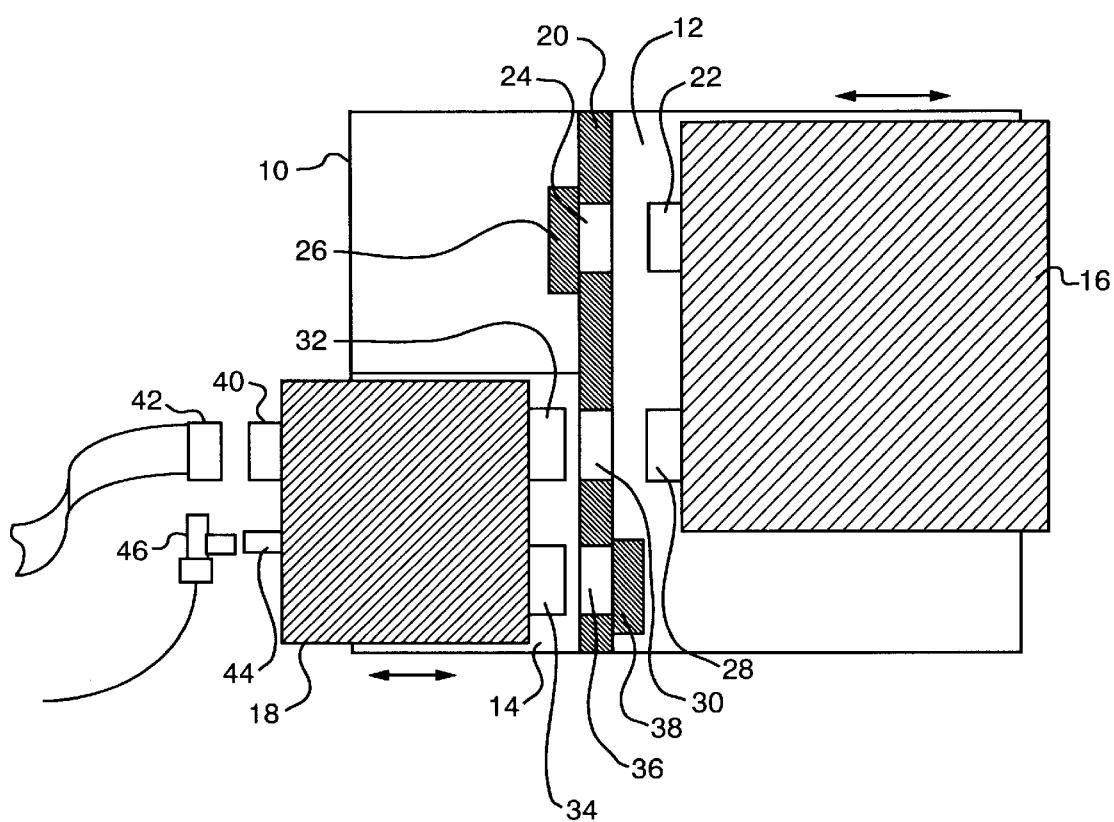
FIG. 1 is a side sectional view of a card cage showing one printed circuit board, a companion card, a back plane, and their placement in one back plane slot.

A card cage 10, FIG. 1, has bay 12 wherein a plurality of printed circuit boards such as a first printed circuit board 16 can be slid in and out to engage with back plane 20. In the preferred embodiment, a standard type first circuit board connector 22 comprising of a 32 bit VME connector is provided to interface with a first back plane bus connector 24 on back plane 20. Connector 24 is electrically connected to at least one connector in each slot in back plane 20 for interfacing to every printed circuit board. As is well known in the art, a back plane "slot" is one column of connectors on one or both sides of a back plane. Back plane 20 provides a common back plane bus 26 interconnecting all card slots and to all cards such as card 58 through circuit board connector 63.

A second circuit board connector 28 on the first printed circuit board 16 would normally connect to a ribbon cable to provide connections to other boards in the card cage (not shown). In the invention, however, circuit board connector 28 connects to passthrough a first back plane passthrough connector 30 on back plane 20 to connect to a first companion card connector 32 of companion card 18. Card 18 is the paddle card which will provide connections to other cards within the back plane system. Card 18 includes a second connector 34 which connects again to back plane 20 via router connector 36. Connector 36 provides connections between connector 36 and other connectors in the same row but in different slots on the back plane through back plane router 38. In the preferred embodiment router 38 can be wire wrapped connections, printed circuit board connections in back plane 20, or other similar equivalent means.

Companion card 18 slides in and out of bay 14 in card cage 10, providing easy access to and insertion of such paddle cards. Companion card 18 provides a plurality of electrical connections from companion card connector 32 to companion card connector 34 to route electrical paths to back plane router 38 through connector 36 to provide electrical paths to other cards in the card cage. Companion card 18 may also include peripheral device connector 40 which can connect to a peripheral device outside of the card cage system through a cable 42. Connector 40 and cable 42 are an example of a parallel port connector. Alternatively, peripheral device connector 44 a coaxial cable connector, can connect with a coaxial cable 46, to provide for serial data, such as ethernet signals. Card 18 provides at least one electrical connection between connector 32 and connector 40 or connector 44, to allow signal paths between connector 32 and connector 40 or 44 of card 18.

Since printed circuit board 16 interfaces only to back plane 20 through connectors 24 and 30, insertion and removal of printed circuit board 16 is easy. There is no need to disconnect ribbon cables from connectors 28 or connectors 22 in order to remove printed circuit board 16. Thus, this invention provides for quick and easy removal of printed circuit boards from the system. Moreover, companion card 18 also connects directly to back plane 20 via connectors 30 and 36. Therefore, companion card 18 is also easily inserted and removed from system 10 to facilitate maintenance and repairs.

Figure 2:
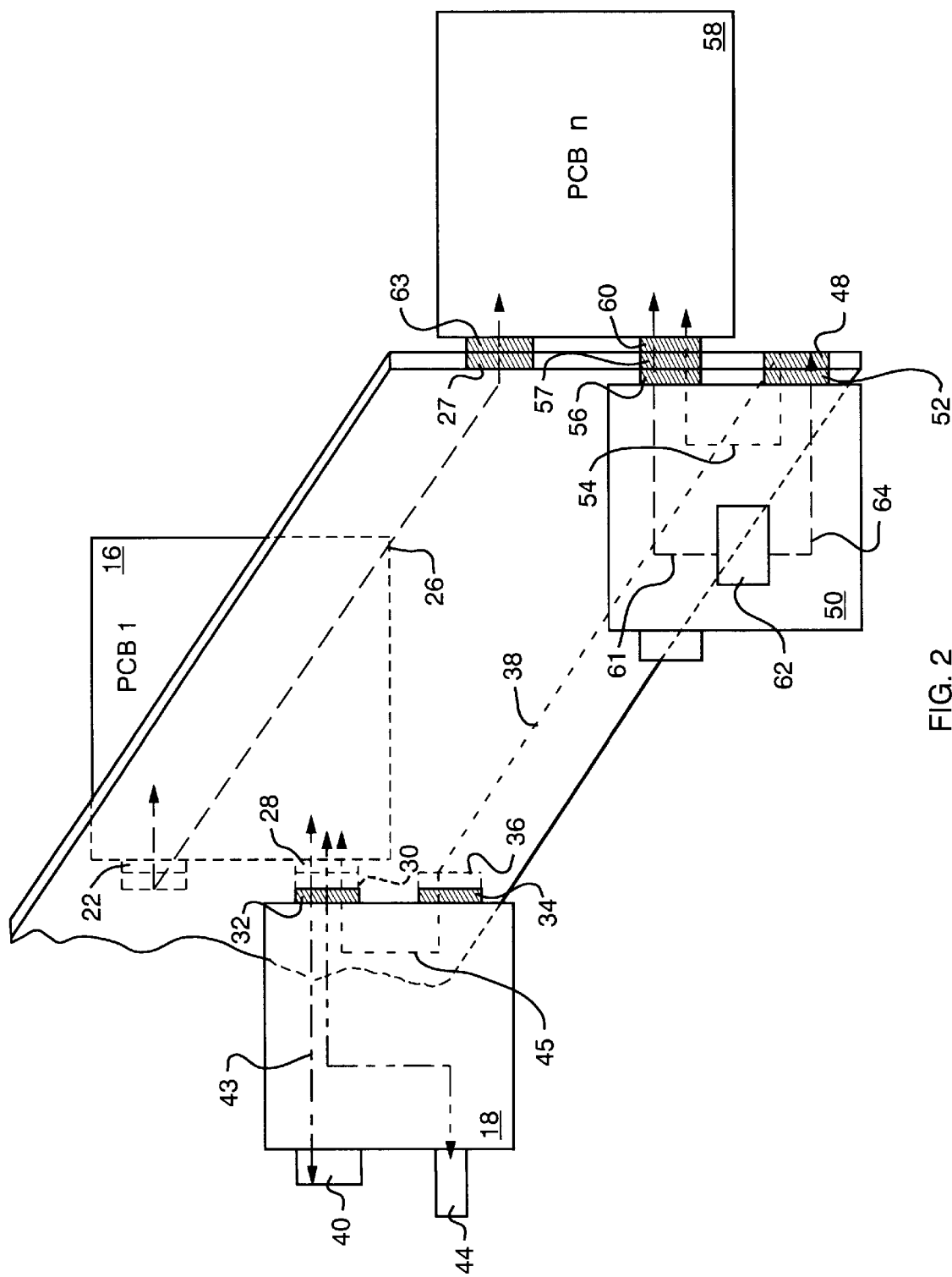
FIG. 2 is a perspective view showing how printed circuit boards and companion cards and the back plane provide electrical connections.

Turning now to FIG. 2 an exploded view of a system including the described invention is shown. A first printed circuit board 16 connects to companion card 18 through connectors 28 and 32 via a pass through connector 30 in the back plane. An electrical path 43 is shown which connects from printed circuit board 16 through connector 28 to connector 32 on companion card 18 and then connects to connector 40 to provide an electrical path to a peripheral device which will plug into connector 40. Another electrical path 45 is shown on card 18 which connects from printed circuit board 16 through connector 28 to connector 32 on card 18 and then connects to connector 34 on card 18 onto router connector 36 in the back plane. A back plane router 38 is provided, possibly by wire wrap or via printed circuit boards, to at least a second back plane router connector 48 in another slot in the back plane system. This provides a connector to at last at least a second companion card 50 through connector 52. Card 50 has an electrical path 54 connecting through connector 48 and connector 52 up to connector 56 which provides a path to a second printed circuit board 58 through a second back plane passthrough connector 57 and a second connector 60. This shows one electrical connection that is provided by the invention from the first printed circuit board 16 to the second printed circuit board 58. There can be hundreds of such connections between such boards in an electronic system.

The companion card needs not only provide passive electrical paths between the connectors. Companion card 50 also shows a path that has extra circuit components on it. Electrical path 61 on card 50 goes from connector 56 into electrical device 62 on card 50. Device 62 can include passive or active electrical components that modify the signal which passes from connector 60 to path 64. For example, such circuitry can include signal amplification, differential driving circuits, pull up resistors, noise isolation circuits, or any other circuit components. The electrical path from device 62 goes through path 64 to connector 52 which connects to connector 48 in the back plane which will provide a connection to another companion card in the back plane (not shown).

Passive or active electrical circuitry may also exist on electrical paths between connectors other than connectors 32 and 34 of card 18. Electrical circuits may exist on path 43 from connectors 32 and 40 of card 18. Such circuitry can include, for example, ethernet collision detection circuitry, analog circuitry telephony signal detection circuits, differential driving circuitry, and noise reduction circuits.

A companion card is often matched to a certain type of printed circuit board to provide the proper electrical paths from the connectors. However, there may be more than one companion card that can be used with a printed circuit board. This will provide the ability to route signals to different pin connectors between the cards in an electronic system.

FIG. 3 shows how different companion cards can be used to route signals when the back plane is hard wired, thereby avoiding having to have specific companion cards assigned to specific slots in the back plane. Printed circuit board 16 connects via connector 28 to companion card 18 through connector 32. Electrical path 70 on card 18 provides a specific path from a specific pin (not shown) on connector 32 to a specific pin (such as pin 2) on connector 34. When companion card 18 is plugged into router connector 36 in slot 1 (72) a data path is provided from pin 2 on connector 36 through electrical path 74 to pin 3 on connector 76 in slot 2 (78). However, if companion card 86 is used instead of companion card 18 in slot 1, a different electrical path is provided which goes to a different slot in the back plane. Card 86 has electrical path 88 which goes from connector 90, to pin 3 of connector 92. This will connect to pin 3 of connector 36 in slot 1 (72), which connects to electrical path 84 which goes to pin 3 of connector 80 in slot 3 (82). Therefore, by using companion card 86 instead of companion card 18, electrical connections can be made to correspond to other slots in the back plane. This connection matching technique may be repeated as often as necessary to provide any configuration for any slot within the card cage.

Alternatively, the wiring of the back plane may be modified as necessary. In such a configuration the companion card would not change, however, the connections between the pins of the connectors could be changed via wire wrapping or by using a different printed circuit interconnection layout between the connectors in the back plane.

By avoiding the use of ribbon cables to connect cards in the back plane there is much less extraneous wiring to be attached and removed for assembly and maintenance of the system. Also, noise can be greatly reduced by providing straight clean connections between cards in the back plane without having extra distance to travel in a ribbon or flexible cable.

As stated previously, companion card may contain supplemental circuitry as well as simple electrical connections. In the preferred embodiment, this circuitry can be analog circuitry thereby separating some analog components from being on the printed circuit board, thereby splitting some functionality between a companion card and printed circuit board pair. This can allow for easier trouble shooting by allowing a certain companion card to be removed depending upon a problem present in the system. For example, if an analog problem occurs in the system the analog companion card may be replaced instead of having to replace the printed circuit board. As another example, if surge protection is provided on the companion card, any damage caused to the system by over-voltage will only affect the companion card, which can be replaced.

Modifications and substitutions by one of ordinary skill in the art are considered to be within the scope of the present invention which is not to be limited except by the claims which follow.

What is claimed is:

1. An electronic assembly interconnection system comprising:
    at least first and second printed circuit boards each having at least first and second printed circuit board connectors;
    at least first and second companion cards each having at least first and second companion card connectors; and
    a back plane having at least first and second sides, wherein said at least first and second printed circuit boards are connected to said first side of said back plane, and said at least first and second companion cards are connected to said second side of said back plane, wherein said back plane includes:
        at least first and second back plane bus connectors on said first side of said back plane, wherein said first back plane bus connector is connected with said first printed circuit board connector of said first printed circuit board, and said second back plane bus connector is connected with said first printed circuit board connector of said second printed circuit board;

a back plane bus providing at least one electrical signal path between said at least first and second back plane bus connectors;

at least first and second back plane router connectors on said second side of said back plane, wherein said first back plane router connector is connected with said second companion card connector of said first companion card, and said second back plane router connector is connected with said second companion card connector of said second companion card;

a back plane router providing at least one electrical signal path between said at least first and second back plane router connectors; and at least first and second back plane passthrough connectors wherein said second printed circuit board connector of said first printed circuit board is connected with said first companion card connector of said first companion card through said first back plane passthrough connector whereby said first printed circuit board and said first companion card are offset within a first plane, and said second printed circuit board connector of said second printed circuit board is connected with said first companion card connector of said second companion card through said second back plane passthrough connector whereby said second printed circuit board and said second companion card are offset within a second plane, parallel to said first plane.

2. The electronic assembly interconnection system of claim 1, wherein said first back plane bus connector has multiple connector pins matching with multiple connector pins of said first printed circuit board connector of said first printed circuit board, said second back plane bus connector has multiple connector pins matching with multiple connector pins of said first printed circuit board connector of said second printed circuit board, and said back plane bus provides multiple electrical signal paths at least between said multiple connector pins of said first back plane bus connector and said multiple connector pins of said second back plane bus connector.

3. The electronic assembly interconnection system of claim 1, wherein said first back plane router connector has multiple connector pins matching with multiple connector pins of said second companion card connector of said first companion card, said second back plane router connector has multiple connector pins matching with multiple connector pins of said second companion card connector of said second companion card, and said back plane router provides multiple electrical signal paths at least between said multiple connector pins of said first back plane router connector and said multiple connector pins of said second back plane router connector.

4. The electronic assembly interconnection system as claimed in claim 3, wherein said second companion card connector includes a 32 bit VME bus connector.

5. The electronic assembly interconnection system of claim 1, wherein at least said first companion card includes:

at least one first electrical path between said first and second companion card connectors, for providing an electrical connection between said back plane router and at least said first printed circuit board through said first back plane router connector, said second companion card connector, said first companion card connector, said first back plane passthrough connector, and said second printed circuit board connector.

6. The electronic assembly interconnection system of 5, wherein at least said first companion card includes:

at least one peripheral device connector for connecting with at least one peripheral device; and at least one second electrical path between said first companion card connector and said at least a peripheral device connector, for providing an electrical connection between at least said first printed circuit board and said at least a peripheral device through said second printed circuit board connector, said first back plane passthrough connector, said first companion card connector, and said at least one peripheral device connector.

7. The electronic assembly interconnection system as claimed in claim 6, wherein said at least a peripheral device connector includes a coaxial cable connector.

8. The electronic assembly interconnection system as claimed in claim 6, wherein said at least a peripheral device connector includes an RS-232 electrical connector.

9. The electronic assembly interconnection system of claim 6, wherein said back plane router includes multiple electrical signal paths, wherein said at least one first electrical path includes multiple electrical signal paths, wherein said at least one second electrical path includes multiple electrical signal paths which correspond with said multiple electrical signal paths of said at least one first electrical path and said multiple electrical signal paths of said back plane router.

10. The electronic assembly interconnection system of claim 5, wherein said back plane router includes multiple electrical signal paths, wherein said at least one first electrical path includes multiple electrical signal paths corresponding with multiple connector pins of said second companion card connector which correspond with said multiple electrical signal paths of said back plane router.

11. The electronic assembly interconnection system of claim 1, wherein at least said second companion card includes:

at least one electrical circuit component modifying an input signal and outputting said input signal modified;

at least one third electrical signal path between said electrical component and said second companion card connector of said second companion card, for providing an electrical connection between said back plane router and said electrical circuit component through said second back plane router connector and said second companion card connector; and at least one fourth electrical signal path between said electrical component and said first companion card connector of said second companion card, for providing an electrical connection between said electrical component and at least said second printed circuit board through said first companion card connector of said second companion card, said second back plane passthrough connector, and said second printed circuit board connector of said second printed circuit board.

12. The electronic assembly interconnection system as claimed in claim 11, wherein said at least one electrical circuit component includes analog circuit components.

13. The electronic assembly interconnection system as claimed in claim 11, wherein said at least one electrical circuit component includes electrical surge protection circuits.

14. The electronic assembly interconnection system as claimed in claim 11, wherein said at least one electrical circuit component includes signal differential driving circuits.

15. The electronic assembly interconnection system as claimed in claim 11, wherein said at least one electrical circuit component includes ethernet collision detection circuitry.

16. The electronic assembly interconnection system of claim 11, wherein said back plane router includes multiple electrical signal paths, wherein said at least one third electrical signal path includes multiple electrical signal paths which correspond with said multiple electrical signal paths of said back plane router.

17. The electronic assembly interconnection system of claim 16, wherein said at least one fourth electrical signal path includes multiple electrical signal paths which correspond with said multiple electrical signal paths of said at least one third electrical path and said multiple electrical signal paths of said back plane router.

* * * * *